(12) United States Patent
Joulia et al.

(10) Patent No.: US 11,466,370 B2
(45) Date of Patent: Oct. 11, 2022

(54) TURBINE ENGINE PART COATED IN A THERMAL BARRIER, AND A METHOD OF OBTAINING IT

(71) Applicants: SAFRAN, Paris (FR); SAFRAN AIRCRAFT ENGINES, Paris (FR); UNIVERSITE PAUL SABATIER TOULOUSE III, Toulouse (FR); CENTRE NATIONAL DE LA RECHERCHE SCIENTIFIQUE (CNRS), Paris (FR)

(72) Inventors: Aurélien Joulia, Moissy-Cramayel (FR); André Hubert Louis Malie, Moissy-Cramayel (FR); Florence Ansart, Lebege (FR); Elodie Marie Delon, Portet-sur-Garonne (FR); Sandrine Duluard, Toulouse (FR)

(73) Assignees: CENTRE NATIONAL DE LA RECHERCHE SCIENTIFIQUE (CNRS), Paris (FR); UNIVERSITE PAUL SABATIER—TOULOUSE III, Toulouse (FR); SAFRAN AIRCRAFT ENGINES, Paris (FR); SAFRAN, Paris (FR)

( * ) Notice: Subject to any disclaimer, the term of this patent is extended or adjusted under 35 U.S.C. 154(b) by 540 days.

(21) Appl. No.: 16/348,369

(22) PCT Filed: Oct. 31, 2017

(86) PCT No.: PCT/FR2017/052996
§ 371 (c)(1),
(2) Date: May 8, 2019

(87) PCT Pub. No.: WO2018/087452
PCT Pub. Date: May 17, 2018

(65) Prior Publication Data
US 2019/0256983 A1  Aug. 22, 2019

(30) Foreign Application Priority Data

Nov. 9, 2016  (FR) .................................... 1660849

(51) Int. Cl.
*B64C 11/20* (2006.01)
*C23C 28/00* (2006.01)
(Continued)

(52) U.S. Cl.
CPC .......... *C23C 28/321* (2013.01); *B64C 11/205* (2013.01); *C04B 35/80* (2013.01);
(Continued)

(58) Field of Classification Search
CPC ..... C23C 28/321; B64C 11/205; C04B 35/80; C04B 38/0051; C04B 41/5042; C04B 41/87; C04B 41/89
(Continued)

(56) References Cited

U.S. PATENT DOCUMENTS

| 10,215,034 | B2 * | 2/2019 | Bullinger | ................ F01D 5/288 |
| 2011/0300357 | A1 * | 12/2011 | Witz | ........................ C23C 4/02 |
|  |  |  |  | 428/689 |

(Continued)

FOREIGN PATENT DOCUMENTS

| CN | 101081735 A | 12/2007 |
| CN | 102245810 A | 11/2011 |

(Continued)

OTHER PUBLICATIONS

International Search Report as issued in International Patent Application No. PCT/FR2017/052996, dated Jan. 31, 2018.
(Continued)

*Primary Examiner* — Tom P Duong
(74) *Attorney, Agent, or Firm* — Pillsbury Winthrop Shaw Pittman LLP

(57) ABSTRACT

A turbine engine part coated in at least a first ceramic layer forming a thermal barrier and including a ceramic material
(Continued)

with first ceramic fibers dispersed in the first layer. The first layer may have a chemical composition gradient between a material for forming a thermal barrier and a material for providing protection against calcium and magnesium aluminosilicates, which is present at a greater content in an outer zone of the first layer, and/or the first layer may be porous and may present a porosity gradient such that an outer portion of the first layer presents lower porosity.

10 Claims, 2 Drawing Sheets

(51) Int. Cl.

| | | |
|---|---|---|
| *C04B 41/52* | (2006.01) | |
| *C23C 4/10* | (2016.01) | |
| *C23C 14/08* | (2006.01) | |
| *C04B 41/00* | (2006.01) | |
| *C23C 18/12* | (2006.01) | |
| *F01D 5/28* | (2006.01) | |
| *C04B 41/87* | (2006.01) | |
| *C25D 13/02* | (2006.01) | |
| *C04B 41/50* | (2006.01) | |
| *C04B 41/89* | (2006.01) | |
| *C04B 35/80* | (2006.01) | |
| *C04B 38/00* | (2006.01) | |
| *C04B 111/00* | (2006.01) | |

(52) U.S. Cl.
CPC ........ *C04B 38/0051* (2013.01); *C04B 41/009* (2013.01); *C04B 41/5042* (2013.01); *C04B 41/52* (2013.01); *C04B 41/87* (2013.01); *C04B 41/89* (2013.01); *C23C 4/10* (2013.01); *C23C 14/083* (2013.01); *C23C 18/127* (2013.01); *C23C 18/1216* (2013.01); *C23C 18/1225* (2013.01); *C23C 18/1241* (2013.01); *C23C 18/1254* (2013.01); *C23C 18/1283* (2013.01); *C25D 13/02* (2013.01); *F01D 5/28* (2013.01); *F01D 5/288* (2013.01); *C04B 2111/00405* (2013.01); *C04B 2235/522* (2013.01); *C04B 2235/526* (2013.01); *F05D 2300/6033* (2013.01); *F05D 2300/614* (2013.01); *F23R 2900/00018* (2013.01)

(58) Field of Classification Search
USPC .......................................................... 428/688
See application file for complete search history.

(56) References Cited

U.S. PATENT DOCUMENTS

| | | |
|---|---|---|
| 2016/0273089 A1 | 9/2016 | Strock |
| 2018/0099909 A1 | 4/2018 | Doesburg et al. |
| 2019/0101020 A1 | 4/2019 | Hugot et al. |

FOREIGN PATENT DOCUMENTS

| | | | |
|---|---|---|---|
| CN | 103403225 A | 11/2013 | |
| CN | 105755418 A | 7/2016 | |
| EP | 2 644 747 A2 | 10/2013 | |
| EP | 2644747 A2 * | 10/2013 | ............. C04B 41/89 |

OTHER PUBLICATIONS

Berndt, C. C., et al., "The Manaufacture and Microstructure of Fiber-Reinforced Thermally Sprayed Coatings," Surface and Coatings Technology, 37 (1989), pp. 89-110.

\* cited by examiner

TURBINE ENGINE PART COATED IN A THERMAL BARRIER, AND A METHOD OF OBTAINING IT

CROSS REFERENCE TO RELATED APPLICATIONS

This application is the U.S. National Stage of PCT/FR2017/052996, filed Oct. 31, 2017, which in turn claims priority to French Patent Application No. 1660849 filed Nov. 9, 2016, the entire contents of all applications are incorporated herein by reference in their entireties.

BACKGROUND OF THE INVENTION

The present invention relates to the general field of thermal barrier coatings used for thermally insulating parts in high-temperature environments. The invention applies more particularly to the thermal barriers used for protecting parts made of superalloys or out of ceramic matrix composite material in aviation gas turbines.

Parts present in the hot portions of an aviation turbine engine that is operated in a desert environment or in surroundings that are very polluted, become degraded quickly because of damage from sand and from alkaline compounds present in the air ingested by the engine. These compounds, known as calcium and magnesium aluminosilicates (CMAS) and comprising in particular oxides of calcium, of magnesium, of aluminum, and of silicon, can degrade the coating that provides a thermal barrier and that covers certain parts in hot portions of a turbine engine.

Among the mechanisms whereby CMAS compounds degrade the thermal barrier, a distinction can be drawn in particular between CMAS compounds infiltrating into the thermal barrier while they are in the liquid state, and the thermal barrier (which is traditionally constituted by a ceramic based on yttria stabilized zirconia (YSZ)) being dissolved and reprecipitated, thereby forming isolated nodules of zirconia that are poor in yttria. Those two mechanisms diminish the mechanical properties of the thermal barrier and can lead to it cracking during stages in which the engine is cooling. Furthermore, the ingestion of solid particles leads to phenomena of the thermal barrier being eroded, which barrier then spalls so as to leave the underlying substrate bare, thereby reducing the lifetime of the parts.

There therefore exists a need for a turbine engine part that is coated in a thermal barrier that presents properties of withstanding CMAS and a lifetime that is improved. There also exists a need to have a method of fabricating such a part that is inexpensive to carry out.

OBJECT AND SUMMARY OF THE INVENTION

A main object of the present invention is thus to mitigate such drawbacks by proposing a turbine engine part coated in at least a first ceramic layer forming a thermal barrier and comprising a ceramic material with first ceramic fibers dispersed in said first layer.

The presence of the first ceramic fibers in the thermal-barrier, first layer of the part of the invention serves to increase the mechanical strength of the thermal barrier and its ability to withstand CMAS compounds. These ceramic fibers serve to reinforce the thermal barrier and to reduce the propagation of cracks that can be generated simultaneously with cyclic oxidation of the barrier during operation of the turbine engine and when it is attacked by CMAS compounds. In summary, in the thermal barrier first layer, the ceramic fibers act as reinforcement serving to improve the intrinsic mechanical properties of that layer. The ceramic fibers may also present properties of withstanding CMAS materials.

In an embodiment, the weight content of first ceramic fibers in the first layer may lie in the range 30% to 90%. For example, the weight content of first ceramic fibers in the first layer may lie in the range 50% to 90%, or indeed 70% to 90%. In general manner, the content of first ceramic fibers in the first ceramic layer is sufficient to perform the mechanical reinforcing function.

In an embodiment, the mean length of the first ceramic fibers may be less than or equal to 50 micrometers (μm). The term "mean length", means the D50 length of the fibers.

In an embodiment, the mean thickness of the thermal-barrier, first layer lies in the range 100 μm to 200 μm.

In an embodiment, the ceramic material of the first layer may be zirconia stabilized by a rare earth oxide, e.g. zirconia that is stabilized or partially stabilized by yttria (YSZ or 8YSZ).

In an embodiment, the first ceramic fibers may be constituted by a material selected from the following: zirconia stabilized by a rare earth oxide; rare earth oxides; pyrochlore structures; rare earth zirconates; alumina $Al_2O_3$; and mixtures thereof. In an embodiment, the first ceramic fibers may comprise a material for providing protection against calcium and magnesium aluminosilicates in order to further strengthen the thermal barrier layer against CMAS compounds. For example, the fibers may comprise a mixture of alumina and at least one rare earth zirconate in order to reinforce the thermal-barrier, first layer chemically against CMAS compounds, in particular when the layer comprises yttria partially stabilized zirconia.

In an embodiment, the first ceramic fibers may be constituted by the same material as the material of the thermal-barrier, first layer.

In an embodiment, the difference between the coefficient of thermal expansion of the material of the first layer and the coefficient of thermal expansion of the material of the first ceramic fibers may be less than or equal to $4 \times 10^{-6}$ per kelvin ($K^{-1}$), or indeed less than or equal to $2 \times 10^{-6} K^{-1}$.

In an embodiment, the coated part may also include a bonding underlayer arranged between a substrate and the thermal-barrier, first layer. In particular, when the substrate is a superalloy (e.g. a superalloy based on iron, on cobalt, or on nickel), the underlayer may comprise an aluminide that may be simple or modified (e.g. NiAl or NiCrAlY for a nickel-based superalloy substrate). In a variant, when the substrate is made of a ceramic matrix composite (CMC) material, the bonding underlayer may comprise silicon, and may for example be formed by silicon or by a metal silicide.

In an embodiment, the part may also be coated in a second ceramic layer comprising a ceramic material for providing protection against calcium and magnesium aluminosilicates, the second layer being situated on the first layer and further comprising second ceramic fibers dispersed in said second layer. The presence of second ceramic fibers serves to improve the mechanical strength of the second layer and its ability to withstand attacks from CMAS compounds. The second layer also serves to plug pores present in the surface of the first layer so as to protect it better against infiltration by CMAS compounds.

In an embodiment, the difference between the coefficient of thermal expansion of the material of the second layer and the coefficient of thermal expansion of the material of the second ceramic fibers may be less than or equal to $4 \times 10^{-6} K^{-1}$, or indeed less than or equal to $2 \times 10^{-6} K^{-1}$.

In an embodiment, the first and second layers may be porous, the first layer presenting a first porosity, and the second layer presenting a second porosity that is strictly less than the first porosity.

In an embodiment, the second ceramic fibers may be constituted by a material selected from the following: zirconia stabilized by a rare earth oxide; rare earth oxides; pyrochlore structures; rare earth zirconates; alumina $Al_2O_3$; and mixtures thereof.

In an embodiment, the second ceramic fibers may be constituted by the same material as the second ceramic layer.

In an embodiment, the weight content of second ceramic fibers in the second layer may lie in the range 30% to 90%. For example, the weight content of second ceramic fibers in the second layer may lie in the range 50% to 90%, or indeed in the range 70% to 90%.

In a first alternative of the invention, the first layer comprises a mixture of a first ceramic material for providing a thermal barrier and of a second ceramic material for providing protection against calcium and magnesium aluminosilicates, the first and second ceramic materials being different, said first layer presenting a first zone extending over a fraction of its thickness and presenting a first weight content of a second material, and a second zone extending over a fraction of its thickness and covering the first zone, the second zone presenting a second weight content of the second material that is strictly greater than the first weight content. This provision serves to obtain a thermal barrier coating on the part that presents a property gradient from the first zone acting mainly as a thermal barrier of the substrate and the second zone that provides the first zone with protection more particularly against CMAS compounds. When a second layer comprising a ceramic material for providing protection against calcium and magnesium aluminosilicates is present on the first layer, the composition gradient serves to provide good thermomechanical compatibility between the first and second layers.

In an embodiment, the ceramic material for providing protection against calcium and magnesium aluminosilicates may be selected from among the following: rare earth oxides; zirconium stabilized by a rare earth oxide; pyrochlore structures; rare earth zirconates; alumina $Al_2O_3$; and mixtures thereof. For example, the ceramic material for providing protection against CMAS may be yttria $Y_2O_3$, cerium and yttrium oxide $Ce_{0.5}Y_{0.5}O_{1.8}$ ("Cérine"), yttrium zirconate $Y_2ZrO_7$, gadolinium zirconate $GdZr_2O_7$, alumina $Al_2O_3$ mixed with a rare earth zirconate, etc.

In a second alternative of the invention, optionally combinable with the first alternative of the invention, the first layer is porous and comprises a first portion extending over a fraction of its thickness and presenting a first porosity, and a second portion extending over a fraction of its thickness and covering the first portion, the second portion presenting a second porosity that is strictly less than the first porosity. With this provision, the first layer has a second portion that presents limited porosity in order to impart effective protection against infiltration by CMAS compounds. This second portion is situated on a first portion of the first layer that presents greater porosity. The more porous first portion serves to improve the ability of the thermal barrier to withstand the stresses imposed by any infiltration of CMAS compounds.

Finally, the invention provides a method of fabricating a part as described above, the method including at least one step of forming the first layer on the part by a wet process. The term "wet process" is used to mean in particular deposition methods of the sol-gel process type, of the dip-coating type, or of the electrophoresis type. In an implementation, the first layer may be formed by a sol-gel process, by dip-coating, or by electrophoresis.

BRIEF DESCRIPTION OF THE DRAWINGS

Other characteristics and advantages of the present invention appear from the following description made with reference to the accompanying drawings, which show an embodiment having no limiting character. In the figures.

DETAILED DESCRIPTION OF THE INVENTION

Figure 1:
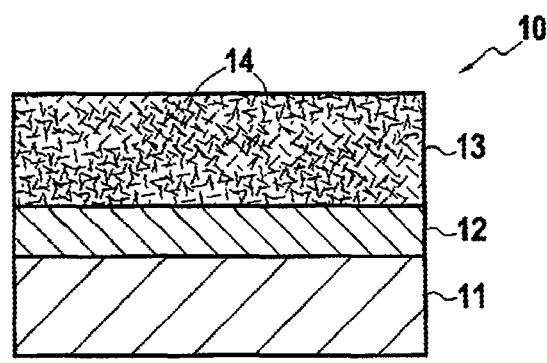
FIGS. 1 to 4 are diagrammatic section views showing the surfaces of coated turbine engine parts in different embodiments of the invention.

FIG. 1 is an enlarged section view of the surface of a turbine engine part 10 comprising a substrate 11 that is covered, in this order, by: a bonding underlayer 12 and a first ceramic layer 13 forming a thermal barrier. In this example, the bonding underlayer 12 is directly in contact with the substrate 11 and with the first layer 13. In this example, the first layer 13 forms an outside layer of the part 10. By way of example, the turbine engine part 10 may be a part present in a hot portion of the turbine engine, such as a turbine, and by way of example it may constitute a turbine blade, a portion of a turbine ring, etc.

By way of example, the substrate 11 may comprise a metal superalloy, e.g. a nickel-based superalloy, or else a CMC material. The bonding underlayer 12, itself known, serves to provide good adhesion of the thermal-barrier, first coating 13 on the substrate 11. More generally, such a bonding underlayer 12 serves to provide good mechanical compatibility between the thermal-barrier, first layer 13 and the substrate 11, serving in particular to compensate for any differential thermal expansion that might exist between the materials of the first layer 13 and of the substrate 11.

When the substrate 11 comprises a metal superalloy, the bonding underlayer 12 may for example comprise a simple aluminide or a modified aluminide (e.g. NiCrAlY for a nickel-based superalloy), that can oxidize in part so as to form an oxide layer (also known as a thermally grown oxide (TGO)). When the substrate 11 comprises a ceramic matrix composite material, the bonding underlayer 12 may comprise silicon or a metal silicide. In general manner, the material of the bonding underlayer 12 is adapted as a function of the material forming the substrate 11 and the thermal-barrier, first layer 13.

In known manner, the thermal-barrier, first layer 13 may comprise yttria stabilized zirconia (YSZ) or yttria partially stabilized zirconia (8YSZ), which generally presents a columnar structure.

The thermal-barrier, first layer 13 contains ceramic fibers 14 that are dispersed therein. The fibers 14 may be made of a ceramic material identical to that of the first layer 13, or in a variant, they may be made of a different material. In any event, it may be ensured that any difference in the coefficients of thermal expansion between the materials of the fibers 14 and of the first layer 13 is less than or equal to $4 \times 10^{-6}$ $K^{-1}$, or indeed less than or equal to $2 \times 10^{-6}$ $K^{-1}$, so as to improve their thermomechanical compatibility.

Figure 2:
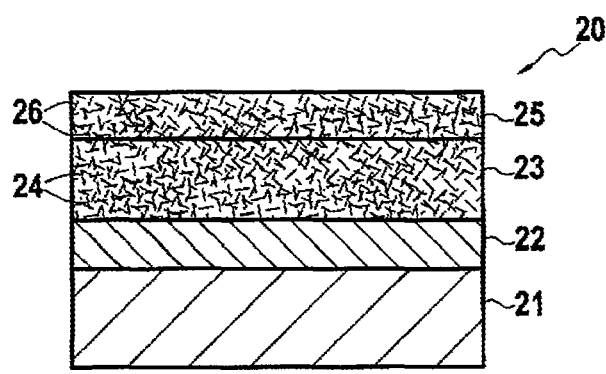

FIG. 2 shows another turbine engine part 20. In similar manner to the above-described part 10, the part 20 comprises a substrate 21 covered in a bonding underlayer 22 on which there is present a first ceramic layer 23 forming a thermal barrier filled with first ceramic fibers 24. In this example, the thermal-barrier, first layer 23 is covered by a second ceramic layer 25 comprising a material for providing protection against CMAS compounds. In this example, the bonding underlayer 22 is directly in contact with the substrate 21 and with the first layer 23. Likewise, the first layer 23 is directly in contact with the second layer 25. In this example, the second layer 25 constitutes an outside layer of the part 20.

Like the first layer 23, the second ceramic layer 25 includes ceramic fibers 26 (second ceramic fibers) that are dispersed therein. The first and second ceramic fibers 24 and 26 may be identical, or in a variant they may be made of different ceramic materials. Like the first ceramic fibers 24, the second ceramic fibers may be made of the same material as the material of the second layer 25. In a variant, the second ceramic fibers 26 may be made of a material that is different from that of the second layer 25, e.g. while taking care that the difference in coefficients of thermal expansion between the materials of the second fibers 26 and of the second layer 25 is less than or equal to $4 \times 10^{-6}$ $K^{-1}$, or indeed less than or equal to $2 \times 10^{-6}$ $K^{-1}$, so as to improve their thermomechanical compatibility.

Figure 3:
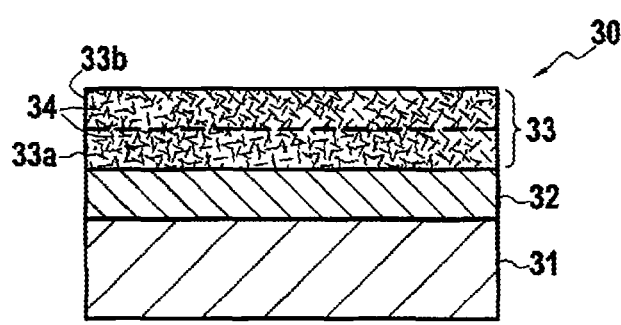

FIG. 3 shows a turbine engine part 30 in a first variant embodiment of the invention. In similar manner to the preceding embodiment, the part 30 comprises a substrate 31 covered by a bonding underlayer 32 on which there is present a first layer 33 forming a thermal barrier filled with first ceramic fibers 34. In this example, the bonding underlayer 32 is directly in contact with the substrate 31 and with the first layer 33. In this example, the first layer 33 constitutes an outside layer of the part 30.

In this example, the thermal-barrier, first layer 33 comprises a mixture of a first ceramic material forming a thermal barrier and of a second ceramic material providing protection against CMAS compounds, and different from the first material. More precisely, the first layer 33 comprises a first zone 33a extending over a fraction of its thickness situated beside the substrate 31 and presenting a non-zero first weight content of the second material. In this example, the first zone 33a is directly in contact with the bonding underlayer 32. The first layer 33 also comprises a second zone 33b situated on the first zone 33a and directly in contact therewith, presenting a second content of the second material that is strictly greater than the first content. In this example, the thermal-barrier, first layer 33 is constituted by two consecutive zones 33a and 33b that are stacked one on the other. Thus, the first layer 33 presents a composition gradient between the first and second zones 33a and 33b so as to improve the resistance of the thermal barrier to CMAS compounds without degrading its properties. This composition gradient also serves, in the event of a second layer made of a material for providing protection against CMAS compounds being present on the first layer 33, to improve compatibility between the first layer 33 and the second layer. It should be observed that the first layer 33 may present a number of zones that is greater than two, while continuing to take care to maintain a composition gradient in the first layer 33.

Figure 4:
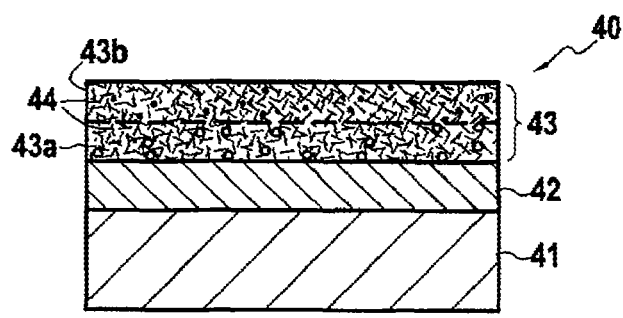

FIG. 4 shows a turbine engine part 40 in a second variant embodiment of the invention. In similar manner to the above embodiment, the part 40 comprises a substrate 41 covered by a bonding underlayer 42 having present thereon a first ceramic layer 43 forming a thermal barrier filled with first ceramic fibers 44. In this example, the bonding underlayer 42 is directly in contact with the substrate 41 and with the first layer 43. In this example, the first layer 43 constitutes an outside layer of the part 40.

In this example, the thermal-barrier, first layer 43 is porous and comprises first and second portions 43a and 43b, each extending over a fraction of the thickness of the first layer 43. The first portion 43a is situated beside the substrate 41 and, in this example, it is directly in contact with the bonding underlayer 42. The second portion 43b covers the first portion 43a and, in this example, it is directly in contact therewith. In this example, the first portion 43a presents a non-zero first porosity, and the second portion 43b presents a non-zero second porosity that is strictly less than the first porosity. Thus, the thermal-barrier, first layer 43 presents a porosity gradient that decreases between the first and second portions 43a and 43b. This arrangement serves to reduce infiltration by CMAS compounds into the second portion 43b, to improve the ability of the first portion 43a to withstand stresses, and in the event of other layers being present on the first layer 43, to improve thermomechanical compatibility between those layers.

Figure 5:
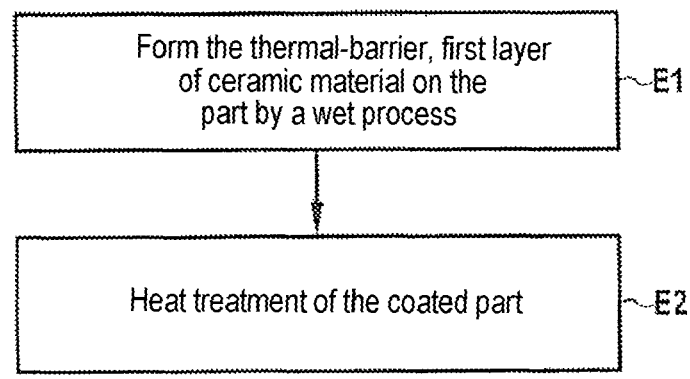
FIG. 5 is a flow chart showing the steps of a method in an implementation of the invention.

The method of fabricating a coated part 10 is described below with reference to the flow chart of FIG. 5.

A conventional prior step consists initially in depositing the bonding underlayer 12 of the substrate 11, e.g. by plasma spraying.

Thereafter, in a step E1, the thermal-barrier, first layer 13 is formed on the bonding underlayer 12 by a wet process. Wet deposition methods comprise in particular dip-coating and electrophoresis. When the first layer 13 is formed by electrophoresis, it may be advantageous to deposit an electrically conductive layer (e.g. gold, silver, or platinum) on the bonding underlayer 12. In order to obtain a first layer 13 filled with first ceramic fibers 14, the bath used for deposition may contain first ceramic fibers 14 in suspension that become deposited together with the material of the first layer 13 on the part 10.

In order to obtain a first layer that presents controlled porosity, it is possible to put a pore-generating agent into the bath, which again becomes eliminated subsequently, e.g. particles of carbon. In a variant, in order to obtain controlled porosity, it is possible to use powders in the bath that present particular morphology and that can impart controlled porosity to the deposited layer. In order to obtain a first layer that presents a composition gradient or a porosity gradient, i.e. zones or portions of different compositions or porosities, it is possible to perform a plurality of successive deposition operations while varying the composition of the bath used for each of them.

It should be observed that, prior to depositing the thermal-barrier, first layer 13, it may be advantageous to deposit an intermediate underlayer made of a ceramic material that is not filled with ceramic fibers in order to improve adhesion of the thermal-barrier, first layer 13 on the bonding underlayer 12. This underlayer may also be deposited by a wet process.

Where appropriate, it is possible to form on the thermal-barrier, first layer 23 a second ceramic layer 25 comprising a material for providing protection against CMAS compounds and that is filled with second ceramic fibers 26. This second layer 25 may likewise be formed by a wet process, in known manner.

Finally, in a step E2, the part 10 as coated in this way may be subjected to heat treatment. During this step, formation of the first layer 13 is finished off and, where appropriate, the pore-generating agent that it contains is eliminated in order to release pores in the first layer. When a plurality of layers are formed on the part, it is possible to perform heat treatment after depositing each layer, or in a variant after depositing all of the layers.

Example

A method has been performed on a turbine engine part made of nickel-based superalloy (type AM1) covered in a bonding underlayer of NiPtAl type. In this example, the object was to obtain a thermal-barrier, first layer comprising an yttria stabilized zirconia matrix having first ceramic fibers made of yttria stabilized zirconia dispersed therein.

In known manner, a first bath was initially prepared in order to obtain a YSZ sol comprising 7.08 milliliters (mL) of 1-propanol, 0.88 mL of acetyl acetone, 4.93 mL of zirconium propoxide, and 2.36 mL of yttrium nitrate.

Thereafter, a second bath was prepared for use subsequently to dip-coat the part with the thermal-barrier, first layer filled with ceramic fibers. The second bath comprised 1-propanol and a dispersing agent of PVP 3500 type at 1%, to which there was added the commercial YSZ powder sold under the name Tosoh TZ6Y, and YSZ ceramic fibers sold by the supplier Zircar Zirconia. In the solid portion of the second bath, the content by weight of YSZ powder in this example was equal to 40 molar percent (mol %). Still in the solid portion of the second bath, the fill by weight of YSZ ceramic fibers in this example was equal to 60 mol %. In this example the ceramic fibers presented a size less than or equal to 50 μm. The total content by weight of YSZ in the bath was about 40 mol %. After stirring under ultrasound with added distilled water, a portion of the first bath was added to the second bath. The second bath as prepared in this way was stirred finally once more.

Thereafter, an intermediate YSZ sol underlayer was deposited on the part so as to improve bonding of the thermal-barrier, first layer made of fiber-filled YSZ on the part. For this purpose, a layer was dip-coated using the previously prepared first bath, followed by stove drying at 50° C. for 5 minutes (min).

Thereafter, the first layer of YSZ filled with first ceramic fibers made of YSZ was deposited from the second previously-prepared bath. For this purpose, a precursor layer for the first layer was dip-coated from the first bath, followed by stove drying at 50° C. for 5 minutes. That operation was repeated until the desired thickness was obtained. In order to obtain thickness lying in the range 150 μm to 200 μm, it is generally necessary to dip at least twenty times.

Finally, the part having the preceding deposit made thereon was subjected to heat treatment in an oven in air, initially at 600° C. for 1 hour (h), followed by a temperature lying in the range 1100° C. to 1250° C. for 2 h, with temperature being varied at 50° C./h between the two pauses.

Figure 6:
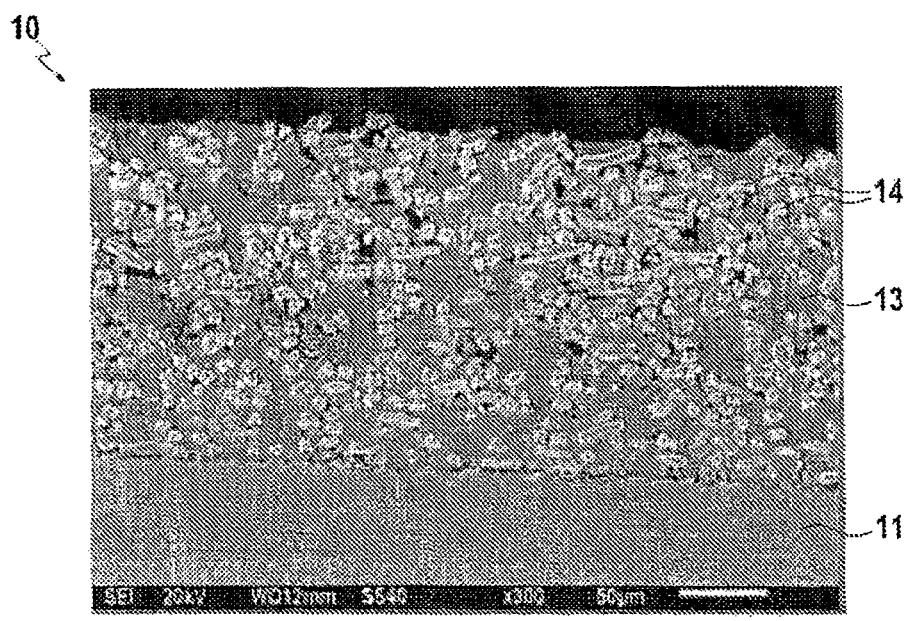
FIG. 6 is a photograph obtained by scanning electronic microscope showing a section of the surface of a coated part obtained by a method of the invention.

After that step, a coated part was obtained, having a surface that is shown in section in FIG. 6 as seen with a scanning electron microscope. The first layer 13 is present on the AM1 superalloy substrate 11. An intermediate YSZ sol underlayer, not visible in the photograph of FIG. 6, is present between the substrate 11 and the first layer 13. The first layer 13 presents mean thickness of about 180 μm. The photograph shows clearly the presence of ceramic fibers 14 within the first layer 13. The mean porosity in the thermal-barrier, first layer 13 in this example is less than 20%. The thermal-barrier, first layer 13 does not present any delamination or cracking, which is representative of thermomechanical stresses being well accommodated.

The invention claimed is:

1. A turbine engine part coated in at least a first ceramic layer forming a thermal barrier and comprising a ceramic material with first ceramic fibers dispersed in said first ceramic layer, wherein
    the first ceramic layer comprises a mixture of a first ceramic material for providing a thermal barrier and of a second ceramic material for providing protection against calcium and magnesium aluminosilicates, the first and second ceramic materials being different, said first ceramic layer presenting a first zone extending over a fraction of its thickness and presenting a non-zero first weight content of a second material, and a second zone extending over a fraction of its thickness and covering the first zone, the second zone presenting a second weight content of the second material that is strictly greater than the first weight content.

2. A part according to claim 1, wherein the weight content of first ceramic fibers in the first ceramic layer lies in the range 30% to 90%.

3. A part according to claim 2, wherein the weight content of first ceramic fibers in the first ceramic layer lies in the range 50% to 90%.

4. A part according to claim 1, wherein the mean length of the first ceramic fibers is less than or equal to 50 μm.

5. A part according to claim 1, wherein the first ceramic fibers are constituted by a material selected from the following: zirconia stabilized by a rare earth oxide; rare earth oxides; pyrochlore structures; rare earth zirconates; alumina; and mixtures thereof.

6. A part according to claim 1, wherein the part is also coated in a second ceramic layer comprising a ceramic material for providing protection against calcium and magnesium aluminosilicates, the second ceramic layer being situated on the first ceramic layer and further comprising second ceramic fibers dispersed in said second ceramic layer.

7. A part according to claim 1, wherein the ceramic material for providing protection against calcium and magnesium aluminosilicates is selected from the following: rare earth oxides, zirconium stabilized by an earth oxide; pyrochlore structures; rare earth zirconates;
    alumina; and mixtures thereof.

8. A method of fabricating a part according to claim 1, including at least one step of forming the first ceramic layer on the part by a wet process.

9. A method according to claim 8, wherein the first ceramic layer is formed by a sol-gel process, by dip-coating, or by electrophoresis.

10. A part according to claim 1, wherein the first layer is porous and comprises a first portion extending over a fraction of its thickness and presenting a first porosity, and a second portion extending over a fraction of its thickness and covering the first portion, the second portion presenting a second porosity that is strictly less than the first porosity.

* * * * *